United States Patent
Khakifirooz et al.

(10) Patent No.: US 9,064,698 B1
(45) Date of Patent: Jun. 23, 2015

(54) THIN-FILM GALLIUM NITRIDE STRUCTURES GROWN ON GRAPHENE

(71) Applicant: International Business Machines Corporation, Armonk, NY (US)

(72) Inventors: Ali Khakifirooz, Mountain View, CA (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/229,936

(22) Filed: Mar. 30, 2014

(51) Int. Cl.
*H01L 21/30* (2006.01)
*H01L 21/46* (2006.01)
*H01L 21/20* (2006.01)
*H01L 21/02* (2006.01)

(52) U.S. Cl.
CPC .... *H01L 21/02444* (2013.01); *H01L 21/02376* (2013.01); *H01L 21/20* (2013.01)

(58) Field of Classification Search
CPC ............ H01L 21/0254; H01L 21/02444; H01L 21/02458; H01L 21/02502; H01L 21/02631; H01L 21/02376; H01L 21/0262; H01L 21/02647; H01L 21/02378; H01L 21/02499; H01L 21/20; H01L 21/02636; H01L 21/02639; H01L 21/02527
USPC ............ 438/105, 458, 481, 455, 46, 496, 977
See application file for complete search history.

(56) References Cited

U.S. PATENT DOCUMENTS

| | | | |
|---|---|---|---|
| 6,452,091 B1 * | 9/2002 | Nakagawa et al. | ........... 136/261 |
| 8,173,551 B2 | 5/2012 | Bai | |
| 8,183,086 B2 | 5/2012 | Sung | |
| 8,409,366 B2 | 4/2013 | Ogihara | |
| 8,431,103 B2 * | 4/2013 | Song et al. | .................... 423/448 |
| 8,450,184 B2 | 5/2013 | Bedell | |
| 8,476,617 B2 | 7/2013 | Dimitrakopoulos | |

(Continued)

FOREIGN PATENT DOCUMENTS

| | | |
|---|---|---|
| EP | 2499658 | 9/2012 |
| JP | 2011230959 | 11/2011 |
| WO | WO2009113472 | 9/2009 |

OTHER PUBLICATIONS

Kunuck Chung et al., Transferable GaN Layers Grown on ZnO-Coated Graphene Layers for Optoelectronic Devices, Science 330,665 (2010).

(Continued)

*Primary Examiner* — Shouxiang Hu
(74) *Attorney, Agent, or Firm* — Louis J. Percello; Otterstedt, Ellenbogen & Kammer, LLP

(57) ABSTRACT

Thin film gallium nitride structures are fabricated by providing a semiconductor-carbon alloy substrate having a dielectric layer on a surface of the substrate, forming trenches in the dielectric layer to expose surface portions of the surface of the substrate, and forming an epitaxial graphene layer on the exposed surface portions of the surface of the substrate. A buffer layer of rare earth metal oxide material is grown epitaxially on the graphene layer. Gallium nitride structures are formed epitaxially on the metal oxide/graphene layers and within the trenches of the dielectric layer, limiting defects by aspect ratio trapping. A stressor layer is formed over the nitride structures. Removing the substrate below the graphene layer allows the nitride structures to be placed on a surrogate substrate.

20 Claims, 4 Drawing Sheets

(56) References Cited

U.S. PATENT DOCUMENTS

| | | | |
|---|---|---|---|
| 8,865,577 B2* | 10/2014 | Wei et al. | ............ 438/481 |
| 2011/0117372 A1 | 5/2011 | Suemitsu | |
| 2012/0112164 A1 | 5/2012 | Chu | |
| 2013/0001516 A1 | 1/2013 | Hebard | |
| 2013/0126865 A1 | 5/2013 | Chiang | |
| 2013/0167897 A1 | 7/2013 | Choi | |
| 2014/0162433 A1* | 6/2014 | Willner | ............ 438/458 |

OTHER PUBLICATIONS

Hyeonjun Baek et al., Epitaxial GaN Microdisk lasers grown on Graphene Microdots, Nano Letters 13(6), ACS Publications (May 14, 2013).

Neeraj Nepal et al., Epitaxial Growth of III-Nitride/Graphene Heterostructures for Electronic Devices, Applied Physics Express 6 (2013), pp. 061003-1 to 061003-4, published Jun. 7, 2013.

* cited by examiner

THIN-FILM GALLIUM NITRIDE STRUCTURES GROWN ON GRAPHENE

FIELD

The present disclosure relates to the physical sciences and, more particularly, to nitride structures grown on semiconductor-carbide substrates through the use of graphene layers.

BACKGROUND

Group III-N semiconductor structures such as gallium nitride structures exhibit unique electronic properties including large bandgaps, which make them suitable for a wide range of applications from power electronics to light emitting diodes. The growth of these materials is generally performed on growth substrates with significant lattice mismatch such as silicon, silicon carbide (SiC) and sapphire. Amongst these substrates, the nitride materials grown on SiC provide the highest material quality. Nonetheless, the relatively high cost of SiC is a major obstacle in widespread use of this epitaxial scheme. Recently, there have been several reports on the growth of GaN on chemical vapor deposition (CVD) formed graphene, which was grown on copper substrates. Graphene has a honeycomb structure and therefore it can serve as a suitable epitaxial template for the growth of nitride materials. Nonetheless, the quality of the epitaxial GaN is limited by the highly granular graphene structure and also lack of nucleation sites due to the pristine crystalline structure of graphene.

The growth of high quality graphene with large grain boundaries has also been reported on SiC substrates. The presence of terraces on the SiC substrate will facilitate the nucleation of GaN layer on graphene. In addition, graphene is prevalently connected to the underlying SiC substrates through van der Waals bond/force, which is weak in nature. The layer transfer of nitride materials has been reported via different methods such as laser lift-off and the controlled spalling technique. The laser lift-off is primarily used for the transfer of nitride structures grown on silicon and sapphire, which calls for the removal of the growth substrate. Spalling-based methods, in general, are predicated on the propagation of a mode of fracture parallel to the surface that is induced by a tensile stressor layer.

SUMMARY

A method provided in accordance with the principles described herein includes providing a silicon carbide substrate having a dielectric layer on a surface of the substrate, forming trenches within the dielectric layer to expose a plurality of surface portions of the substrate within the trenches, the trenches having a selected aspect ratio, and forming an epitaxial graphene layer within the trenches on the exposed surface portions of the substrate. An epitaxial buffer layer is formed from a rare earth oxide material exhibiting a hexagonal lattice structure directly on the graphene layer. Epitaxial gallium nitride structures are formed on the epitaxial buffer layer and within the trenches in the dielectric layer. The gallium nitride structures are separated from the substrate along a plane between the graphene layer and the substrate.

A further method includes obtaining a silicon carbide substrate having a dielectric layer on a surface of the substrate and trenches within the dielectric layer that expose a plurality of surface portions of the substrate within the trenches, forming an epitaxial graphene layer within the trenches on the exposed surface portions of the substrate, and forming an epitaxial buffer layer from a rare earth oxide material exhibiting a hexagonal lattice structure directly on the graphene layer. An epitaxial gallium nitride layer having a wurzite crystal structure is formed within each of the trenches. The gallium nitride layer within each trench is formed directly on the epitaxial buffer layer and has sufficient thickness to form a defect-free surface portion. The method further includes separating the gallium nitride layers and dielectric layer from the substrate along a plane between the graphene layer and the substrate.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Nitride structures and fabrication methods as disclosed herein can provide substantial beneficial technical effects. For example, one or more embodiments may provide one or more of the following advantages:

Facilitates controlled spalling;
Enables re-use of substrate material;
Enables selective epitaxial growth of nitride structures on graphene islands;
Facilitates growth of high-quality nitride layers;

These and other features and advantages will become apparent from the following detailed description of illustrative embodiments thereof, which is to be read in connection with the accompanying drawings.

DETAILED DESCRIPTION

Gallium nitride structures are grown on high-quality graphene templates which are, in turn, grown on silicon carbide (SiC) substrates in accordance with exemplary embodiments as discussed below. Surface steps (terraces) on the SiC substrate can serve as nucleation sites for the growth of a gallium nitride layer on graphene. Weak van der Waals bonds between the graphene and SiC substrate permit the use of graphene as a weak fracture layer during layer transfer using a spalling mode fracture. The use of the weak graphene layer will therefore ease the requirements for the stressor layer in terms of the stress and thickness while allowing the reuse of the relatively expensive SiC substrate. Moreover, the silicon carbide substrate can be oxidized and patterned prior to graphene growth in order to enable selective epitaxial growth of graphene. Such patterning will in turn enable selective epitaxial growth of nitride structures only on graphene islands. Subsequently, the selective/local layer transfer of nitride structures onto a surrogate substrate will be facilitated due to the presence of locally grown graphene templates.

Figure 1:
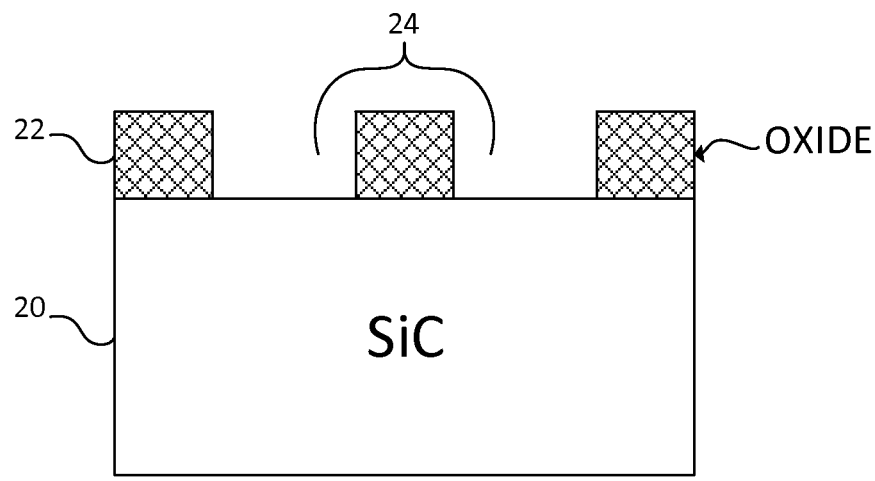
FIG. 1 is a schematic sectional view of a silicon carbide substrate including a patterned oxide layer.

An exemplary method includes providing a silicon carbide substrate 20 as shown in FIG. 1. In some embodiments, the substrate carbon has an atomic concentration of 45-55%. Impurities or dopants may be present in the substrate. A dielectric layer 22 of selected thickness (for example, 50 nm-4 µm) is deposited on the substrate 20 in some embodiments. Plasma-enhanced chemical vapor deposition (PECVD) is one method known to those of skill in the art for depositing dielectric layers. The dielectric layer is formed on the substrate top surface by thermal oxidation in other embodiments. Materials such as silicon dioxide, silicon oxynitride, and silicon nitride are among the dielectric materials that may be employed to form the dielectric layer 22. The dielectric layer 22 is patterned to form trenches 24. Photolithographic techniques familiar to those of skill in the art followed by etching may be employed to form the trenches. If the dielectric layer is formed from silicon dioxide, hydrogen fluoride is among the materials that may be employed for such etching. The trenches 24 expose selected portions of the top surface of the SiC substrate 20. As discussed further below, the thickness of the dielectric layer 22 corresponds to the depths of the trenches 24. The patterning of the dielectric layer is designed to provide trench widths or diameters having specific dimensions. The ratio of the depth to the width of the trenches is known as the aspect ratio. The selection of an appropriate aspect ratio contributes to the formation of epitaxial structures within the trenches that have portions that are substantially free of defects. The trenches 24 have uniform depths and widths in some embodiments, which corresponds to an aspect ratio of one (1).

Figure 2:
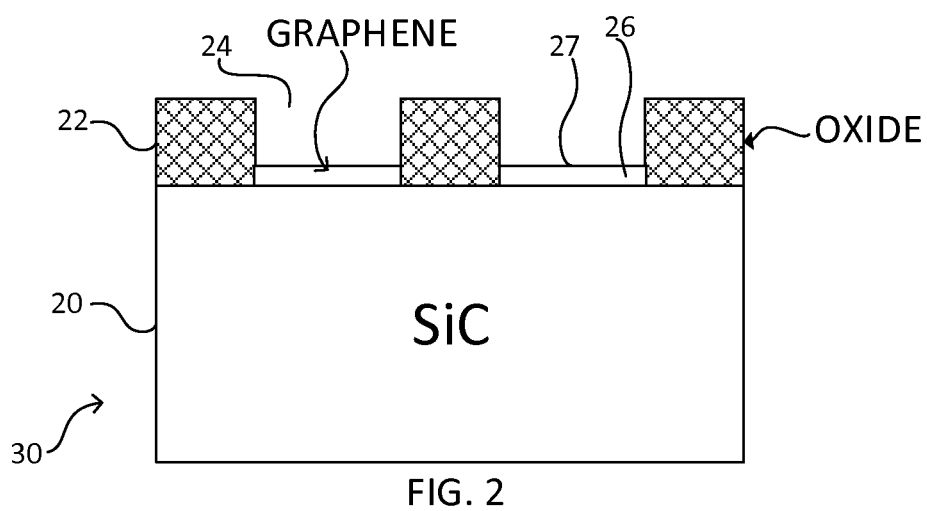
FIG. 2 is a schematic sectional view of the structure of FIG. 1 further including a graphene layer.

Graphene is grown epitaxially on the exposed, dielectric-free surface portions of the SiC substrate 20. The epitaxial graphene film layer 26 is a single monolayer of graphene in some embodiments and includes multiple graphene monolayers bonded by van der Waals forces in other embodiments. The graphene film is single or multi-layer whereby the number of layers is in the range of two (2) to twenty (20) layers in one or more exemplary embodiments. The graphene layer(s) has a honeycomb crystal structure. One exemplary technique known in the art for forming a graphene layer on a crystalline semiconductor-carbon alloy layer is an annealing process that converts a surface layer of the alloy layer into the graphene layer. The annealing process can be performed in a vacuum at an elevated temperature between, for example, 900-1,400° C. to cause desorption of silicon from the surface of a silicon carbide substrate. Carbon-containing precursor gases can be introduced during such a graphitization process to replace carbon that may also be lost through desorption. An alternative or complementary exemplary technique for forming the graphene layer(s) is chemical vapor deposition (CVD). A carbon-containing precursor such as $C_2H_2$ or $C_2H_4$ is decomposed in a process chamber. The deposition can be conducted in a vacuum (e.g. $10^{-6}$ Torr) at temperatures between 1,000-1,400° C. An exemplary structure 30 as shown in FIG. 2 is thereby obtained.

Figure 3:
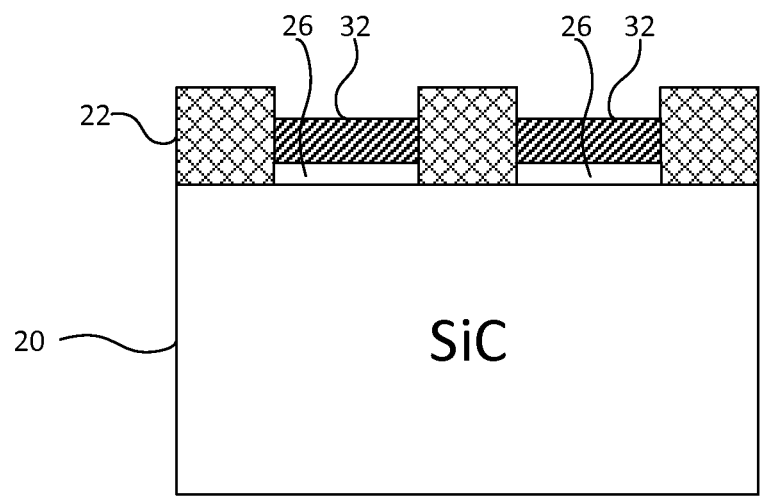
FIG. 3 is a schematic sectional view of the structure of FIG. 2 further including nitride structures on the graphene layer.

Nitride structures 32 are selectively grown on the structure 30 as shown in FIG. 3. In order to facilitate nucleation, a single-crystal hexagonal oxide material is grown as a buffer layer 27 directly on the graphene layer 26 in one or more embodiments, as shown in FIG. 2. Exemplary semiconducting oxide materials for forming such a buffer layer include erbium oxide and lanthanum oxide. The buffer layer can be provided by molecular beam epitaxy (MBE), forming a layer having a wurtzite crystal structure on the graphene layer. The nitride structures 32 grown on the buffer layer include a gallium nitride (GaN) layer having a thickness between 50 nm and two microns (2 µm) in one or more embodiments. Gallium nitride layers in some embodiments further include indium or aluminum (InGaN, AlGaN). The defect density of the nitride layer can be reduced by aspect ratio trapping (ART) in some embodiments. As discussed above, the width and depth of the trenches 24 formed in the dielectric layer have selected dimensions. The trench dimensions and nitride layer thickness are selected to facilitate aspect ratio trapping in which defects that may originate at the boundary between the nitride and buffer layers terminate at the trench sidewalls and beneath the top surface of the nitride layer. Accordingly an upper portion of the nitride layer can be substantially defect-free. The lattice structure of the epitaxially deposited gallium nitride layer is hexagonal (wurtzite) in one or more exemplary embodiments. The nitride layers are grown using an MOCVD technique at temperatures below 1200° C. The gallium nitride structures 32 in some embodiments each consist of a single layer of gallium nitride that is grown directly on the buffer layer. The gallium nitride layer may consist essentially of gallium and nitrogen having a wurtzite structure. The gallium nitride layer further includes indium or aluminum in other embodiments. InGaN and AlGaNn also both have wurtzite crystal structures. The depths of the trenches 24 exceed the thicknesses of the gallium nitride layers formed therein in one or more embodiments. In further exemplary embodiments, the gallium nitride structures include multiple layers wherein at least one of the layers is a gallium nitride layer that directly contacts the buffer layer. In the case of a multiple layer structure, the gallium nitride bottom layer that contacts the buffer layer preferably has a top surface portion that is substantially free of crystal defects. As discussed above, such a top surface portion can be obtained by aspect ratio trapping. In some embodiments, one or more device layers are formed on the gallium nitride layer. Such device layers may comprise all or part of a functional electronic device. In some embodiments, one or more of the device layers is doped. One or more of the device layers includes gallium nitride, possibly further including indium or aluminum (e.g. InGaN or AlGaN).

Figure 4:
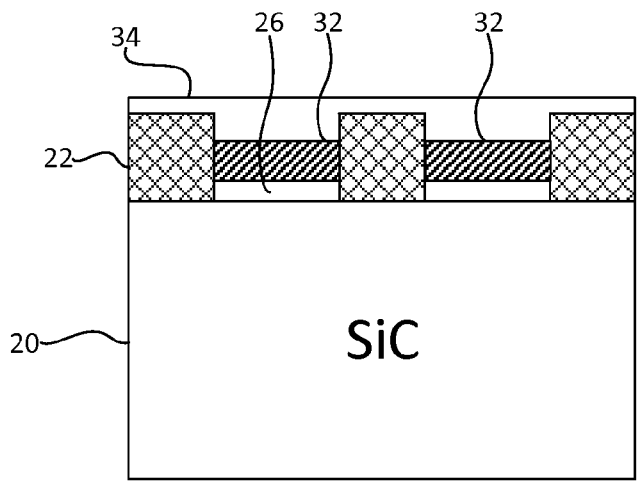
FIG. 4 is a schematic sectional view of the structure of FIG. 3 further including a stressor layer formed thereon.
Figure 5:
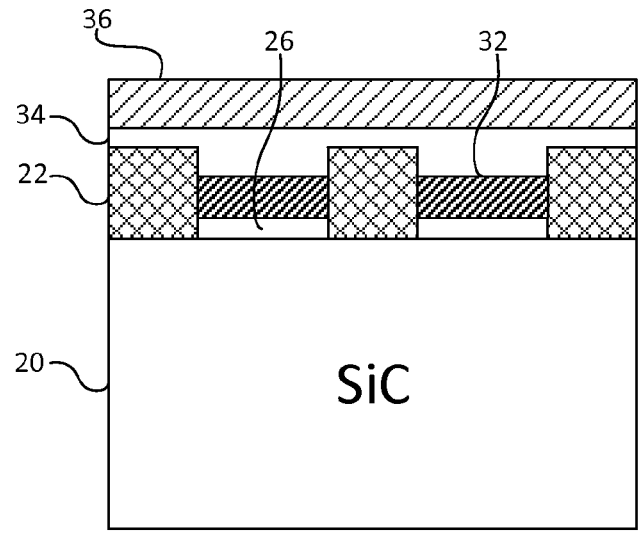
FIG. 5 is a schematic sectional view of the structure of FIG. 4 further including a flexible handle layer formed on the stressor layer.

A stressor layer 34 is deposited on the structure shown in FIG. 3. As shown in FIG. 4, the stressor layer 34 is formed on the exposed surfaces of the nitride structures 32 and the patterned oxide layer. In some embodiments, the stressor layer is a tensile stressed metal layer. The metal layer is a nickel (Ni) layer in some embodiments. The thickness of the stressor layer is selected to facilitate controlled spalling in some embodiments as opposed to spontaneous spalling of the underlying structure. As discussed in U.S. Pat. No. 8,450,184, which is incorporated by reference herein, the thickness of the stressor layer to be deposited can be approximated from the fracture toughness of the underlying structure. By forming the nitride structures on graphene as described herein, the requirements for forming the stressor layer 34 are eased as the relatively weak graphene layer ensures that fracturing will occur along a desired plane below the graphene layer. Multiple metal layers comprise the stressor layer 34 in some embodiments. A flexible handle layer 36 is bonded to the stressor layer 34 as shown in FIG. 5. The flexible handle layer is a polyimide tape in one or more embodiments. Mechanical force exerted on the flexible handle layer 36 and stressor layer 34 causes a controlled fracture in the underlying structure.

Figure 6:
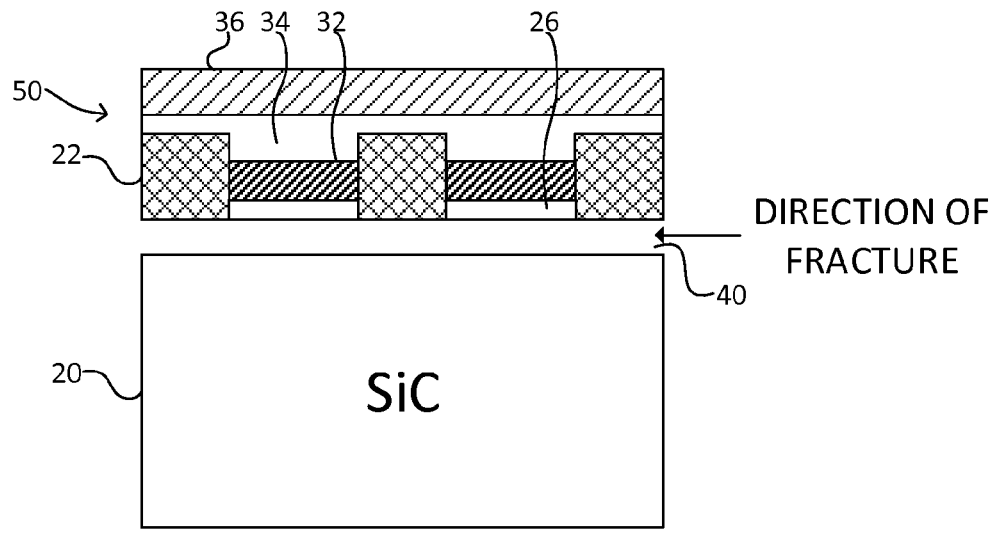
FIG. 6 is a schematic sectional view of the structure of FIG. 5 showing fracture of the silicon carbide substrate.

Referring to FIG. 6, the semiconducting nitride structures 32 are separated from the silicon carbide substrate 20 as a fracture 40 is formed upon the exertion of sufficient mechanical force on the stressor layer 34. The fracture occurs along the plane between the graphene layer 26 and the substrate 20. Fracture and separation of the nitride structures from the substrate may occur simultaneously. While the dielectric layer 22 is transferred from the substrate with the nitride structures in some embodiments, such as shown in FIG. 6, it may in fact remain with the substrate 20 depending on the adhesion of the dielectric layer to the substrate as compared to its adhesion to the stressor layer 34. It will be appreciated that some dielectric materials have greater adhesion to silicon carbide or metal than others. Accordingly, in some embodiments a structure 50 as shown in FIG. 6 is obtained. In other embodiments, the dielectric layer 22 will be missing from the transferred layer.

Figure 7A:
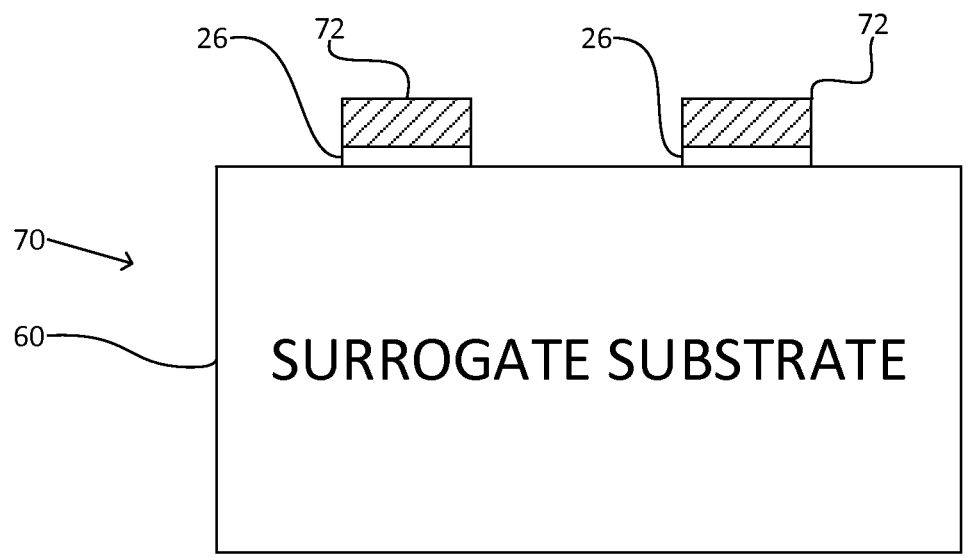
FIG. 7A is a schematic sectional view of the structure of FIG. 6 showing transfer of the nitride structures to a surrogate substrate.

In some embodiments, the structure including the gallium nitride structures is transferred to a surrogate substrate 60 following the spalling process. As shown in FIG. 7A, a structure 70 is obtained following removal of the dielectric layer 22 (if present), the removal of the stressor layer 34 and the flexible handle layer 36, and device fabrication. As discussed above, device fabrication may be conducted partially or entirely prior to the spalling process. In some embodiments where device fabrication has been partially completed prior to spalling, ohmic contacts are formed on the gallium nitride structures 32 following spalling. Optionally, the graphene layer 26 and the buffer layer 27 between the nitride structures and graphene layer can also be removed (not shown). In some embodiments, the graphene layer 26, which is electrically conductive, is retained as a transparent electrical contact. The surrogate substrate 60 can be a glass substrate, a polymeric substrate, a metal substrate, or a semiconductor substrate such as silicon. In some embodiments, the surrogate substrate itself contains electronic devices such as silicon-based circuits. Device fabrication using the nitride structures to form discrete, free standing electronic devices 72 such as transistors or LEDs is conducted in accordance with conventional processing techniques familiar to those of skill in the art or other techniques that may become known in the future. Such free standing devices are amenable to cooling if used in power applications, LEDs, or other applications wherein cooling is to be facilitated if possible. The dielectric layer 22, if not removed during spalling, can be etched away if desired using a selective etching process. Hydrogen fluoride may be employed to remove silicon dioxide dielectric layers without materially affecting the gallium nitride structures 32.

Figure 7B:
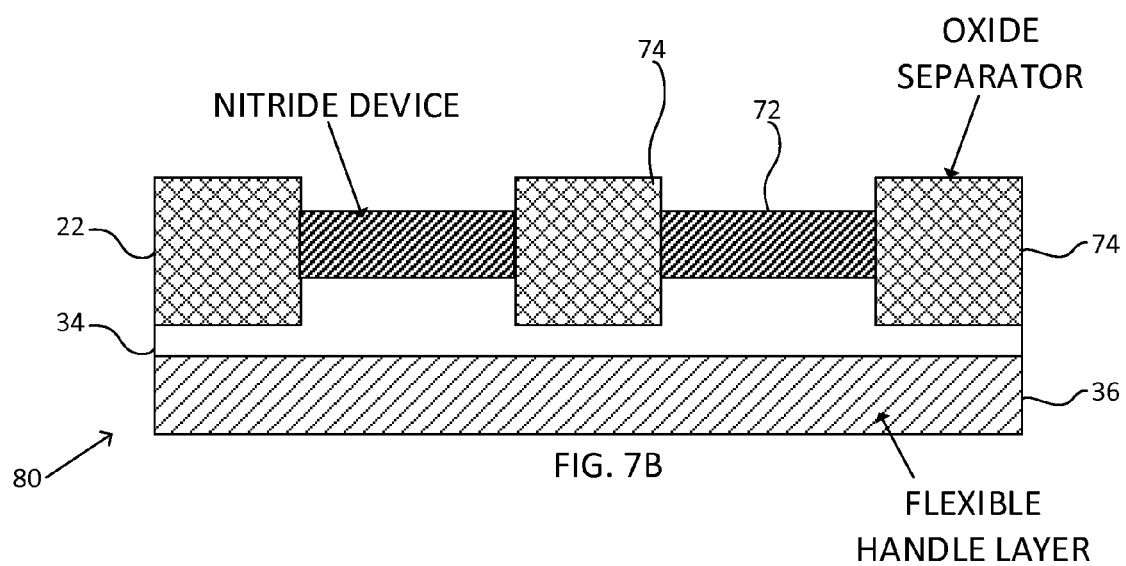
FIG. 7B is a schematic sectional view of the structure of FIG. 6 showing use of the stressor layer as a back contact followed by removal of graphene and buffer layers.

In an alternative embodiment, the stressor layer 34 is employed as a back electrical contact. As shown in FIG. 7B, the structure 50 obtained following spalling is subjected to selective etching to remove the buffer and graphene layers. The dielectric layer 22, which forms dielectric (e.g. oxide) separators 74 in the exemplary embodiment, remains with the transferred structure 50. Device fabrication using the nitride structures is performed following removal of the graphene and buffer layers to form electronic devices 72 such as transistors or LEDs in some embodiments. The exemplary structure 80 shown in FIG. 7B is thereby obtained.

Given the discussion thus far and with reference to the exemplary embodiments discussed above and the drawings, it will be appreciated that, in general terms, an exemplary method includes providing a silicon carbide alloy substrate 20 having a dielectric layer 22 on a surface of the substrate and patterning the dielectric layer to form trenches that expose a plurality of surface portions of the surface of the substrate 20 such as shown in FIG. 1. An epitaxial graphene layer 26 is formed on the exposed, oxide-free surface portions of the substrate and a buffer layer 27 is epitaxially grown on the graphene layer. Hexagonal, single-crystal rare earth metal oxides grown on the graphene layer facilitate GaN nucleation. Selective epitaxial growth of single-crystal nitride semiconductor structures on the buffer layer provides a structure such as shown in FIG. 3. In one or more embodiments, a stressor layer 34 is formed over the nitride structures. The method further includes causing a fracture 40 along a plane between the graphene layer 26 and the silicon carbide substrate by exerting a force on the stressor layer and separating the gallium nitride structures from the substrate. The gallium nitride structures are transferred to a surrogate substrate 60 in some embodiments, such as shown in FIG. 7A. The method may further include removal of the dielectric layer either during the spalling process or following transfer of the nitride structures to a surrogate substrate. The buffer and graphene layers are removed in some embodiments to form further structures as shown by way of example in FIG. 7B. The gallium nitride structures are used to form electronic devices in one or more embodiments. Aspect ratio trapping facilitates the growth of gallium nitride layers having defect-free surface portions despite possible lattice mismatch between the gallium nitride layers and underlying buffer layers 27. The upper portion of the gallium nitride layer in each trench accordingly includes a single crystal lattice structure while the long range order of the crystalline structure beneath the upper portion thereof may be disrupted. The upper portion of the gallium nitride layer includes a top surface on which further semiconductor layers can be grown and is also described herein as the surface portion or the top surface portion. In one or more embodiments wherein the epitaxial gallium nitride structures include a plurality of layers, at least one of the layers is a gallium nitride layer having a bottom surface directly contacting the epitaxial buffer layer and a top surface. Crystal defects are trapped beneath the top surface of the gallium nitride layer using aspect ratio trapping. In some embodiments, a gallium nitride layer grown directly on the buffer layer consists essentially of gallium and nitrogen. In some other embodiments, the gallium nitride structure includes one or more layers that consist essentially of indium gallium nitride or aluminum gallium nitride. In embodiments including indium gallium nitride ($In_xGa_{1-x}N$) or aluminum gallium nitride ($Al_xGa_{1-x}N$), x is greater than zero and less than or equal to 0.4.

Those skilled in the art will appreciate that the exemplary structures discussed above can be distributed in raw form or incorporated as parts of intermediate products or end products that benefit from having gallium nitride-based devices therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A method comprising:
   providing a silicon carbide substrate having a dielectric layer on a surface of the substrate;
   forming trenches within the dielectric layer to expose a plurality of surface portions of the substrate within the trenches, the trenches having a selected aspect ratio;
   forming an epitaxial graphene layer within the trenches on the exposed surface portions of the substrate;
   forming an epitaxial buffer layer from a rare earth oxide material exhibiting a hexagonal lattice structure directly on the graphene layer;
   forming epitaxial gallium nitride structures on the epitaxial buffer layer and within the trenches in the dielectric layer, and
   separating the gallium nitride structures from the substrate along a plane between the graphene layer and the substrate.

2. The method of claim 1, wherein the step of forming the gallium nitride structures further includes forming at least one epitaxial gallium nitride layer having a selected thickness and a wurtzite crystal structure directly on the epitaxial buffer layer, wherein the selected thickness of the gallium nitride layer and the aspect ratio of the trenches are sufficient to provide a substantially defect-free surface portion within the gallium nitride layer.

3. The method of claim 2, further including:
   forming a stressor layer over the epitaxial gallium nitride structures, and
   causing a fracture along the plane between the graphene layer and the substrate by exerting a force on the stressor layer.

4. The method of claim 3, further including forming electronic devices using the epitaxial gallium nitride layer.

5. The method of claim 4, further including transferring the gallium nitride structures to a surrogate substrate.

6. The method of claim 5, further including removing the graphene and buffer layers prior to transferring the gallium nitride structures to the surrogate substrate.

7. The method of claim 5, further including removing the stressor layer following the step of transferring the gallium nitride structures to the surrogate substrate.

8. The method of claim 7, further including the step of removing the dielectric layer.

9. The method of claim 2, wherein the buffer layer includes at least one of single-crystal erbium oxide and single-crystal lanthanum oxide.

10. The method of claim 3, further including attaching a flexible handle layer to the stressor layer.

11. The method of claim 10, further including the step of separating the dielectric layer from the substrate upon separating the gallium nitride structures from the substrate.

12. The method of claim 11, further including removing the graphene layer and the buffer layer.

13. The method of claim 12, further including forming electronic devices within the trenches using the gallium nitride structures following removal of the graphene and buffer layers.

14. The method of claim 11, wherein the gallium nitride layer is one of a GaN, AlGaN and InGaN layer.

15. The method of claim 11, wherein each of the epitaxial gallium nitride structures includes a plurality of layers, at least one of the layers being a gallium nitride layer having a bottom surface directly contacting the epitaxial buffer layer and a top surface, further including the step of trapping crystal defects beneath the top surface of the gallium nitride layer.

16. The method of claim 15, wherein the gallium nitride layer consists essentially of gallium and nitrogen.

17. A method comprising:
   obtaining a silicon carbide substrate having a dielectric layer on a surface of the substrate and trenches within the dielectric layer that expose a plurality of surface portions of the substrate within the trenches;
   forming an epitaxial graphene layer within the trenches on the exposed surface portions of the substrate;
   forming an epitaxial buffer layer from a rare earth oxide material exhibiting a hexagonal lattice structure directly on the graphene layer;
   forming an epitaxial gallium nitride layer having a wurtzite crystal structure within each of the trenches directly on the epitaxial buffer layer and having sufficient thickness to form a defect-free surface portion, and
   separating the gallium nitride layers and dielectric layer from the substrate along a plane between the graphene layer and the substrate.

18. The method of claim 17, further including:
   forming a stressor layer over the epitaxial gallium nitride layers, and
   causing a fracture along the plane between the graphene layer and the substrate by exerting a force on the stressor layer.

19. The method of claim 18, further including transferring the gallium nitride layers to a surrogate substrate.

20. The method of claim 19, further including removing the graphene and buffer layers prior to transferring the gallium nitride layers to the surrogate substrate.

* * * * *